March 12, 1957 B. N. SLADE 2,784,478

ELECTROFORMING SEMI-CONDUCTOR DEVICES

Filed Aug. 20, 1952

INVENTOR.
BERNARD N. SLADE

BY H. C. Newton

ATTORNEY

United States Patent Office 2,784,478

Patented Mar. 12, 1957

2,784,478

ELECTROFORMING SEMI-CONDUCTOR DEVICES

Bernard N. Slade, Morristown, N. J., assignor to Radio Corporation of America, a corporation of Delaware Application August 20, 1952, Serial No. 305,350

4 Claims. (Cl. 29—25.3)

This invention relates generally to semi-conductor devices of the type known as transistors and particularly relates to a process of electrically forming the collector electrode of such devices.

Conventional point contact transistors generally include a block of a semi-conducting material such as silicon or germanium which is provided with two closely adjacent emitter and collector electrodes in rectifying contact with one surface region of the material; and a base electrode which provides a large-area, low-resistance contact with another surface region of the semi-conducting material. The emitter and collector electrodes may be point contact electrodes. For operation as an amplifier, for example, a voltage is impressed between collector and base electrodes in the reverse direction while a voltage in the forward direction is impressed between the emitter and base electrodes. Assuming an N-type crystal, a negative potential is required on the collector with respect to the base electrode and a positive potential on the emitter with respect to the base electrode. If a P-type crystal is used, the potentials must be reversed. Such a device provides voltage as well as current gain under proper operating conditions and may be considered as a three terminal network having a common input and output terminal.

When the two point contact electrodes are pressed against the semi-conducting body they are likely to have similar electrical characteristics and either electrode may be used as the collector electrode. In such cases, the emitter current in the forward direction may have only a small influence on the collector characteristics.

The effect of the emitter current on the collector electrical characteristics may be termed the transistor action of such devices and usually can be improved by electrically treating or electroforming that electrode which is to be used as the collector.

One such treatment comprises passing a relatively large pulse of current through the collector point in the reverse direction. The effect of this process is to reduce the reverse resistance of the collector and to increase the influence of the emitter current on the collector characteristics.

In using a transistor as an amplifier, for example, it is generally better and in some cases necessary to have a high value of collector resistance, $R_c$. The electroforming process above-referred to lowers the effective value of $R_c$. As a result, unless $R_c$ is of a relatively high value before the collector electrode is formed, $R_c$ may be reduced to such a low value as to reduce the available power gain and thus render the transistor useless for general purposes. This results in a loss of production time, money and material.

It is accordingly the principal object of the present invention to provide an improved semi-conductor device having superior electrical characteristics suitable as an amplifier, oscillator or the like, and to provide an improved method of preparing such a device.

A further object of the invention is to provide a device of the type referred to having a higher equivalent collector resistance than previously known transistor devices whereby the device of the invention may be utilized, for example, in an amplifier circuit which will have a very high power gain.

In accordance with the present invention, one or both of the rectifying electrodes of a semi-conductor device is electrically treated by first impressing an alternating (A. C.) potential between the collector and base electrodes while the emitter circuit is open. The effect of this electrical treatment is to increase the value of the effective collector resistance. The device is then subjected to a further electrical treatment which consists of impressing an electrical charge or direct current (D. C.) pulse between the collector and base electrodes in the reverse direction while a predetermined value of emitter current is flowing. The latter treatment may be called pulsing and may be effected by discharging a previously charged capacitor between the collector and base electrodes.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
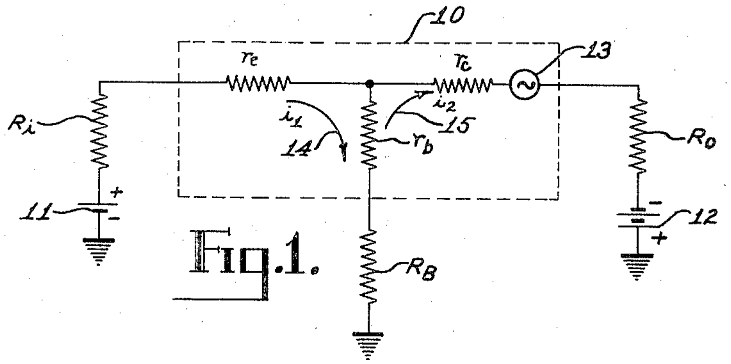
Figure 1 is an equivalent schematic circuit diagram of a semi-conducting amplifier in accordance with the invention, the device being represented as a T-network.

Referring now to Figure 1, the T-network enclosed within the dotted box 10 schematically represents a transistor. The T-network consists of a vertical branch or resistor $r_b$ and of a horizontal branch including resistors $r_e$ and $r_c$, to the junction point of which $r_b$ is connected. A generator having zero impedance is indicated at 13 and includes the product of $r_m$ and $i_1$, where $i_1$ indicates the emitter current flowing in the direction shown by arrow 14. $i_2$ indicates the collector current flowing in the direction shown by the arrow 15. An external input resistance $R_i$ is connected between $r_e$ and a bias potential source such as a battery 11, and an external output resistance $R_o$ is connected in circuit with $r_c$ and a similar battery 12. An external base resistance $R_b$ is connected between the base electrode or $r_b$ and ground.

For the following discussion it is desirable to introduce the following symbols: $R_{11}=r_e+r_b$; $R_{21}=r_m$; $R_{12}=r_b$ and $R_{22}=r_c+r_b$. $R_{11}$ is the equivalent emitter resistance, $R_{21}$ is the transfer resistance, $R_{12}$ is the equivalent base resistance and $R_{22}$ is the equivalent collector resistance. Since $r_b$ is commonly small as compared to $r_c$, $R_{22}$ is approximately equal to $r_c$. The equivalent collector resistance $r_c$ may be defined by the partial differential quotient of the collector voltage with respect to the collector current while the emitter current is maintained constant. For a further explanation of the equivalent emitter and base resistance and of the transfer resistance, reference is made to a paper by J. Bardeen and W. H. Brattain which appears on pages 239 to 277 of the April 1949 issue of "Bell System Technical Journal" and entitled "Principles involved in transistor action" (see particularly pages 249–251).

The maximum available gain neglecting feedback, is obtained when $R_0$ is approximately equal to $R_{22}$ and when $R_i$ is approximately equal to $R_{11}$. The power gain of the semiconductor device neglecting the effects of feedback may be defined as follows:

$$\text{Gain}=\frac{\alpha^2 R_{22}}{4R_{11}}$$

where $\alpha$ equals the current gain of the transistor.

It may be seen that as $R_{22}$ or $r_c$ is increased the available gain of the device is increased. It is, therefore, desirable to maintain a relatively large value of $r_c$ and consequently a large value of $R_{22}$.

Figure 2:
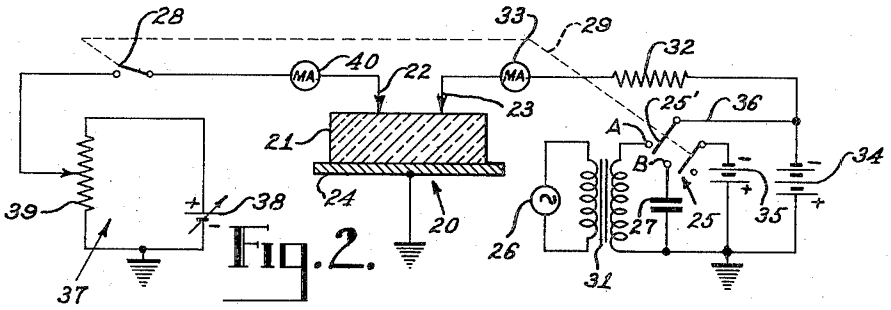
Figure 2 is a schematic circuit diagram of a semi-conductor device arranged for operation in accordance with the invention.

Referring now to Figure 2, a semi-conductor device or transistor 20 is arranged to be electroformed in accordance with the present invention. The transistor 20 includes a body 21 which consists of a semi-conducting material such as germanium, which preferably has a resistivity of less than 5 ohm-centimeters. An emitter electrode 22 and a collector electrode 23 are in rectifying contact with one surface of the body 21. The distance between the emitter electrode and the collector electrode is preferably less than .002 inch. Attached to body 21 is a base electrode 24 which is in low-resistance contact with the body.

In order to improve the transistor action of the transistor one or both of the rectifying electrodes are subjected to an electro-forming treatment in accordance with the present invention.

The forming treatment includes two steps. For the first step, an A. C. voltage of a predetermined value is applied between the collector and base electrodes of the transistor for a certain period of time. The second step comprises the application of a D. C. pulse between the collector and base electrodes.

The first step is carried out by applying between the collector and base, an A. C. voltage having a root mean square (R. M. S.) value of less than 100 volts and preferably of between 30 and 70 volts R. M. S. The frequency of the applied voltage may be approximately 60 cycles per second (C. P. S.) and the voltage is applied between the collector and base for a period of 0.1 second or less. During the course of the A. C.-forming step the emitter circuit is open so that the A. C.-forming of the collector electrode does not affect the emitter electrode. As a result of the A. C.-forming step the value of the effective collector resistance is greatly increased.

The second or D. C.-forming step is carried out by discharging through the collector and base electrodes, a capacitor which has previously been charged from a potential source of approximately 180 volts. The capacitor may have a capacity approximately equal to 0.001 microfarad (mfd.). During the course of the D. C.-forming step a predetermined value of emitter current is caused to flow through the emitter circuit. The emitter current $i$, may normally be between 0.2 and 2 milliampere (ma.). As a result of the D. C.-forming step the value of the effective collector resistance is decreased.

Thus, the A. C.-forming step is used to raise the value of the collector resistance while the D. C.-forming step is used to decrease the collector resistance and increase the value of current gain, $\alpha$.

To this end, a double-blade, double-throw switch 25 is adapted to selectively connect an A. C. voltage generator 26 or a capacitor 27 in circuit with the collector electrode 23 and the base electrode 24. A further switch 28 for opening the emitter circuit may be linked to the switch 25 as indicated by the dotted line 29. The A. C. voltage generator 26 is connected to a coupling transformer 31 which is selectively connected to the electrode 23 through switch 25 and a current limiting resistor 32. A milliammeter 33 is provided in circuit with the electrode 23 to indicate the electrode current. A battery 34 is connected between the collector electrode 23 and the base electrode 24 and supplies at all times a reverse biasing voltage to the electrode 23.

A further battery 35 is selectively connectable across the capacitor 27 by means of switch 25 and charges capacitor 27 to a predetermined value. The capacitor 27 is selectively discharged through conductive lead 36, limiting resistor 32, electrode 23, crystal 21 and base electrode 24. It is to be noted that the electrical charge is applied between the collector and base electrodes in the reverse direction. The electrical charge which is thus applied may vary between 1.8 and 36 microcoulomb and preferably between 5.4 and 18 microcoulomb.

The emitter circuit 37 which includes a battery 38 and a potentiometer 39 is selectively connectable to the emitter electrodes 22 through switch 28. A milliammeter 40 is provided in circuit with the emitter 22 to indicate the value of the emitter current.

During the A. C.-forming step, the emitter circuit 35 is opened by means of switch 28; accordingly the surface of the semi-conducting body in the vicinity of the emitter electrode is not affected by the A. C.-forming of the collector electrode. However, prior to the application of the D. C. pulse to the collector, the emitter circuit is closed and a current of about 0.2 milliamperes is permitted to flow through the emitter electrode. The emitter current may be controlled by varying the emitter bias battery 38, the potentiometer 39 or both.

The switches 25 and 28 are so coupled that when the blade 25' of switch 25 is in position A, for example, whereby the generator 26 is connected in circuit with the collector electrode 23, the switch 28 is open. Furthermore, when blade 25' of switch 25 is in position B whereby the capacitor 27 is connected in circuit with electrode 23, the switch 28 is closed.

The physical effect which the D. C.-pulsing treatment of the semi-conducting device produces is not known at the present time. However, it is believed that the comparatively large electrical charge applied between the collector and the base electrode breaks down the barrier layer of the crystal. Consequently $r_c$ and therefore $R_{22}$ is decreased. Furthermore it is believed that the pulsing improved the ability of the collector electrode to collect charge carriers. It has been found that by treating the collector electrode with an A. C. voltage prior to the D. C. or pulse-forming step the resistance $r_c$, is substantially increased. The decrease in resistance caused by the D. C. forming does not, therefore, reduce the value of $r_c$ below a desired large value, for example of 20,000 ohms.

Figure 3:
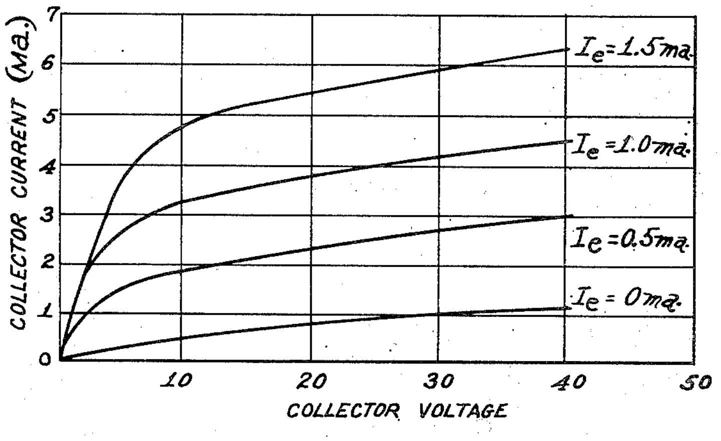
Figure 3 is a graph showing curves of the collector current plotted with respect to the collector voltage for a semi-conductor device in accordance with the present invention, each curve being plotted for a fixed value of emiter current.

Referring now to Figure 3 there is shown a group of curves showing collector current plotted with respect to collector voltage for a typical transistor treated in accordance with the present invention. The slope of the curves is representative of the effective collector resistance. It may be seen that except for very low values of collector voltage the collector resistance is approximately constant and independent of emitter current. The value of the collector resistance is seen to be approximately 30,000 ohms. It is important that for transistors employed in switching type circuits, for example, the collector resistance at zero emitter current be as high as possible.

As stated above, the D. C.-forming step, although it improves transistor action, tends to lower the value of the collector resistance. If the collector resistance is initially 30,000 ohms, for example, it may be reduced as a result of the D. C.-forming treatment to a value below 20,000 ohms. It is, therefore, necessary that the initial value of collector resistance be made as large as possible.

The results of the A. C.-forming step on four transistors in accordance with the present invention are illustrated in the table below:

| Transistor No. | $r_c$ (ohms) before A. C.-forming | $r_c$ (ohms) after A. C.-forming |
|---|---|---|
| 1 | 15,000 | 120,000 |
| 2 | 20,000 | 120,000 |
| 3 | 15,000 | 50,000 |
| 4 | 22,000 | 66,000 |

It is apparent from the table that the resistance of the collector electrode, $r_c$, was greatly increased as a result of the A. C.-forming step. The four transistors were subsequently subjected to the D. C.-forming step whereupon $r_c$ decreased from the values shown in the above table. In each case, however, the resulting value of $r_c$ was well above the 20,000 ohm limit.

There has thus been disclosed a process for forming the electrodes of a semi-conductor device. The electrodes are formed by first passing an A. C. current between the collector and base electrodes for a period of 0.1 second or less, during which time the emitter circuit is open. One or more D. C. pulses are then impressed between the collector electrode and the base electrode in the reverse direction. During the D. C. pulsing step the emitter circuit is closed allowing current to flow therethrough. The resulting device has a high current gain, a high power gain and a relatively high equivalent collector resistance.

What is claimed is:

1. The process of treating a transistor device of the type having a semi-conducting crystal, a base electrode in low-resistance contact with said crystal, and an emitter and collector electrode in rectifying contact with said crystal, said process comprising the steps of passing an alternating electrical current between said collector electrode and said base electrode for a predetermined period of time, during which time no current is permitted to flow between said emitter electrode and said base electrode, and then passing pulses of electrical current between said collector electrode and said base electrode while simultaneously passing an electrical current of a predetermined value between said emitter electrode and said base electrode.

2. The process of treating a transistor device as defined by claim 1 wherein said predetermined period of time is not larger than 0.1 second and said predetermined value of electrical current passing between said emitter electrode and said base electrode is between 0.2 and 2 milliamperes.

3. The process of treating a transistor device of the type having a semi-conducting crystal, a base electrode in low-resistance contact with said crystal, and first and second electrodes in rectifying contact with said crystal, said process comprising the steps of passing an alternating electrical current between said first electrode and said base electrode for a predetermined period of time, during which time no current is permitted to flow between said second electrode and said base electrode, and then passing pulses of electrical current between said first electrode and said base electrode while simultaneously passing an electrical current of a predetermined value between said second electrode and said base electrode.

4. The process of treating a transistor device of the type having a semiconducting crystal, a base electrode in low resistance contact with said crystal, and first and second electrodes in rectifying contact with said crystal, said process comprising the steps of passing an alternating current between said first electrode and said base electrode for a predetermined period of time, and then passing pulses of electrical current between said first electrode and said base electrode while simultaneously passing an electrical current of a predetermined value between said second electrode and said base electrode.

References Cited in the file of this patent

UNITED STATES PATENTS

| | | |
|---|---|---|
| 2,446,467 | Fry | Aug. 3, 1948 |
| 2,623,103 | Kircher | Dec. 23, 1952 |
| 2,697,269 | Fuller | Dec. 21, 1954 |